(12) United States Patent
DiMarco

(10) Patent No.: US 6,356,459 B1
(45) Date of Patent: Mar. 12, 2002

(54) METHOD AND APPARATUS FOR EMI SHIELDING OF ELECTRICAL COMPONENTS

(75) Inventor: Mario DiMarco, Scottsdale, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/612,140

(22) Filed: Jul. 7, 2000

(51) Int. Cl.[7] .................................................. H05K 9/00
(52) U.S. Cl. ...................... 361/818; 361/800; 361/816; 174/35 R; 206/719
(58) Field of Search ................................ 361/800, 816, 361/818, 801; 174/35 R; 206/719; 211/41.17

(56) References Cited

U.S. PATENT DOCUMENTS

| | | | | |
|---|---|---|---|---|
| 4,806,703 A | * | 2/1989 | Sims | 174/35 MS |
| 5,192,893 A | * | 3/1993 | Velasco et al. | 315/85 |
| 5,304,964 A | | 4/1994 | DiMarco | |
| 5,323,298 A | * | 6/1994 | Shatas et al. | 361/816 |
| 5,534,663 A | * | 7/1996 | Rivers et al. | 174/35 GC |
| 5,550,713 A | * | 8/1996 | Pressler et al. | 361/818 |
| 5,581,047 A | * | 12/1996 | Lazaroff | 174/35 R |

* cited by examiner

Primary Examiner—Jayprakash N. Gandhi

(57) ABSTRACT

An EMI shielded enclosure for shielding an electrical component from electromagnetic radiation includes a first cover, a second cover, a top member having a first end, a second end, a first side face and a second side face, a bottom member having a first end, a second end, a first side face and a second side face, a front member connected to the first ends of the top member and the bottom member and having a first side face and second side face, and a back member connected to the second ends of the top member and the bottom member and having a first side face and a second side face. The first cover is attached to the first side faces of the front, back, bottom and top members, wherein at least one of the front, back, bottom and top members has a tapered first side face. The second cover is attached to the second side faces of the front, back, bottom and top members.

21 Claims, 3 Drawing Sheets

METHOD AND APPARATUS FOR EMI SHIELDING OF ELECTRICAL COMPONENTS

BACKGROUND

Present-day commercial and military aircraft incorporate highly complex electronic control systems incorporating numerous sensors, force transducers and servo systems, as well as the electronics necessary for processing the sensor signals and developing the requisite control signals for the transducers and the like so that the aircraft can be flown in a controlled manner. Typically, the electronic assemblies involved will be housed in metallic shielding enclosures or boxes which are adapted to slide into equipment racks on the aircrafts.

It is well known that electromagnetic radiation may interfere with the operation of electronic assemblies. Accordingly, it is important to provide an electromagnetic interference (EMI) shielding enclosure around each of the electronic assemblies. Ideally, the enclosure for each peripheral device is designed as a Faraday cage. A Faraday cage typically includes a sixsided box made of metal or other conductive material. The interfacing of the sides to each other is referred to in the industry as "EMI seams." To be effective, a Faraday cage should have "tight" EMI seams, that is, the interface of two sides of the cage should reduce or eliminate EMI so that it is not able to penetrate the seam and interfere with the electrical component.

One type of EMI seam used in electronic packaging incorporates the use of gaskets or discrete springs. These devices are typically compressed between two surfaces of the cage, such as a cover and housing, making a continuous electrical bond from the housing through the gasket or spring to the cover. The springs and gaskets are typically made of flexible conductive materials, such as metal and/or modified elastomers. FIG. 1A shows a row of discrete spring fingers embedded in the wall of a Faraday cage. FIG. 1B shows the EMI seam between two walls of a Faraday cage with one wall comprising the row of discrete springs fingers of FIG. 1A. While spring fingers are used in many commercial applications, they may require customization, are susceptible to damage, and require many fasteners for retention.

Another type of EMI seam includes the fastening of a flat plate or cover to a flat frame or housing using the appropriate amount of fasteners necessary to make a continuous electrical bond at the perimeter. However, this EMI seam typically requires a large number of screws to prevent buckling of the flat plate to the flat frame. In military applications, screw spacing as close as one inch has been implemented. The flat plates must also be manufactured from relatively thick pieces of sheet metal that can withstand buckling. Both of these constraints result in increased hardware and manufacturing costs.

SUMMARY OF THE INVENTION

Various aspects of the present invention relate to methods and apparatus for providing inexpensive and practical EMI shielding for a variety of electrical components such as circuit card assemblies. In accordance with an exemplary embodiment of the present invention, the enclosure includes a frame member for housing the electrical components to be shielded. According to one embodiment, the frame member includes a front member, a back member, a bottom member and a top member wherein the sides of at least one of said members is tapered. The enclosure may further include covers that are attached to the sides of the front, back, bottom and top members to form a Faraday cage. The front and/or the back member may be configured to retain at least one electrical component, such as a circuit card assembly, within the Faraday cage. By securely attaching the covers to the tapered sides of the front, back, bottom and/or top members, a load is imparted to the covers thereby producing a tight and continuous EMI seam, effectively shielding the electrical components from EMI.

Other embodiments of the invention relate to a method of shielding an electrical component by compressively engaging covers to a frame member having at least one of two side faces that is tapered.

BRIEF DESCRIPTION OF THE DRAWINGS

A detailed description of embodiments of the invention will be made with reference to the accompanying drawings, wherein like numerals designate corresponding parts in the several figures, and wherein.

DETAILED DESCRIPTION OF THE INVENTION

The following descriptions are of exemplary embodiments only and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1B:
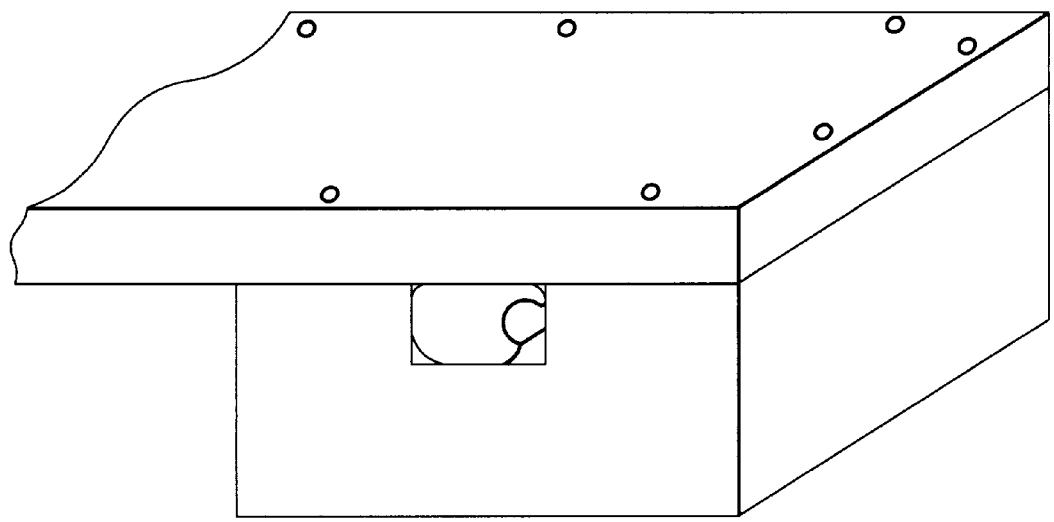
FIG. 1B is an isometric view of an EMI seam of a Faraday cage incorporating the spring fingers of FIG. 1A.
Figure 1A:
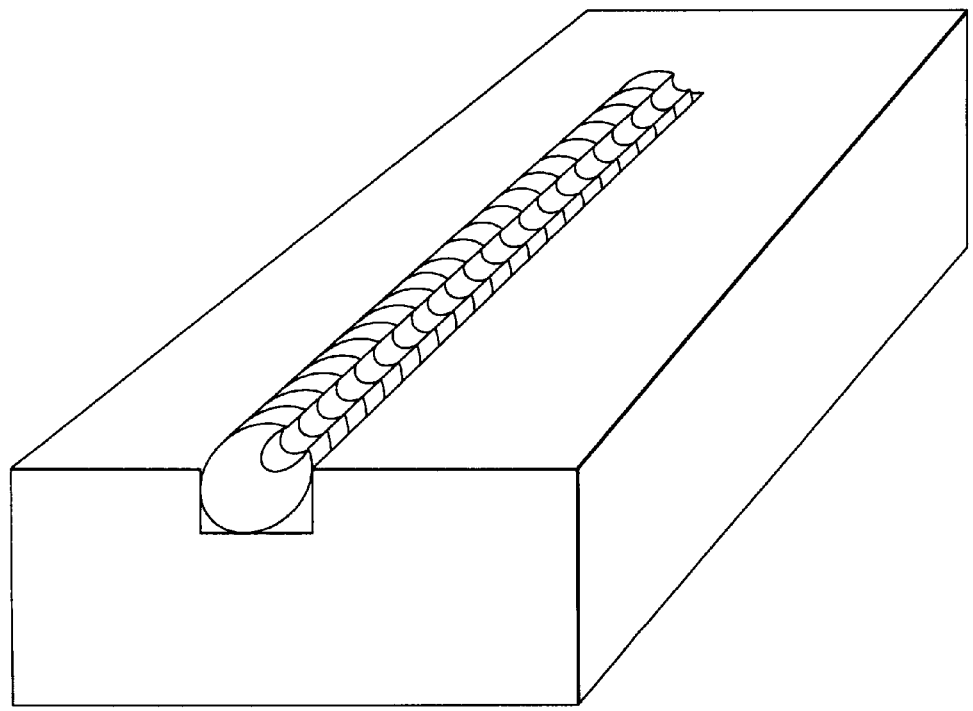
FIG. 1A is an isometric view of spring fingers embedded in the wall of a Faraday cage.
Figure 2:
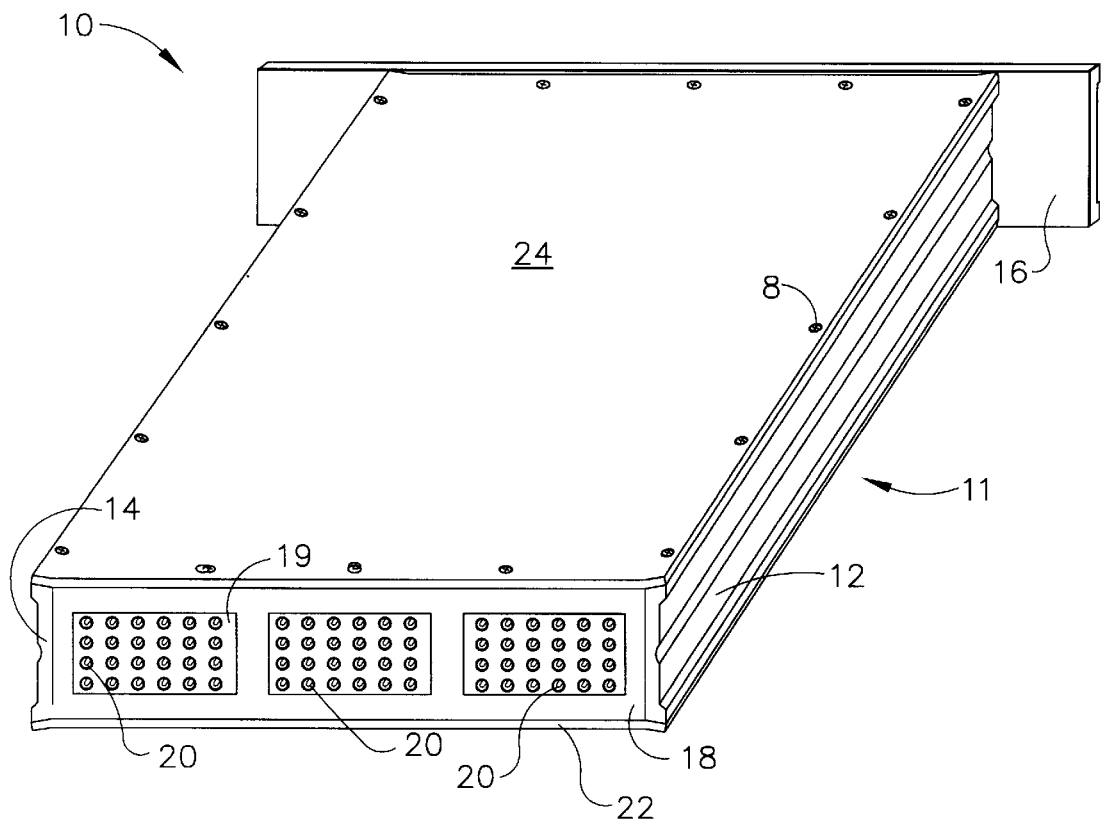
FIG. 2 is an isometric view of an embodiment of the EMI shielded enclosure of the present invention.

FIG. 2 shows an enclosure 10 to provide EMI shielding from electromagnetic radiation for electronic circuit boards and electronic devices in accordance with an embodiment of the invention. Enclosure 10 in FIG. 2 includes a frame 11 with a top member 12 and a bottom member 14, a front member 16 and a back member 18. Top member 12 and bottom member 14 are each attached tightly at one end to front member 16 by fasteners (not shown) which may be screws, rivets, solder or the like. Bottom member 14 and top member 12 have an optional rail (not shown) used to guide enclosure 10 as enclosure 10 slides into a cabinet or an equipment rack (not shown) on tracks in the rack. Top member 12 and bottom member 14 are each attached at their other end to back member 18. Back member 18 includes a connector shell 19 with a plurality of holes through which electrical connectors 20 are inserted. The number of holes in connector shell 19 corresponds to the number of electrical connectors connecting to the electrical device(s) within enclosure 10. Top member 12, bottom member 14, front member 16 and back member 18 may be suitably comprised of lightweight, durable, and substantially rigid material such as aluminum or an aluminum alloy. Top member 12, bottom member 14, front member 16 and back member 18 may be joined tightly to covers 22 and 24 by an array of fasteners, which may be screws 8 or any other suitable fasteners. Alternatively, covers 22 and 24 may be attached by gas or liquid pressure, clamps, staking or adhesive. Covers 22 and 24 may be comprised of conductive material with suitable flexibility and thickness so that when subjected to loads, as described more fully below, covers 22 and 24 do not permanently deform. Typical materials for this purpose include aircraft grade aluminum sheet metal, such as 6061-T6 aluminum, although equivalent conductive materials could achieve the same results. The thicknesses of covers 22 and 24 depend on the materials from which the covers are made. Typically, if made from 6061-T6 aluminum, covers 22 and 24 may be of a thickness between 0.005 inches and 0.1 inches, such as approximately 0.05 inches, although it will be appreciated that, depending on the material used, any thickness that permits flexibility but which resists permanent deformation under load may be used.

Figure 3:
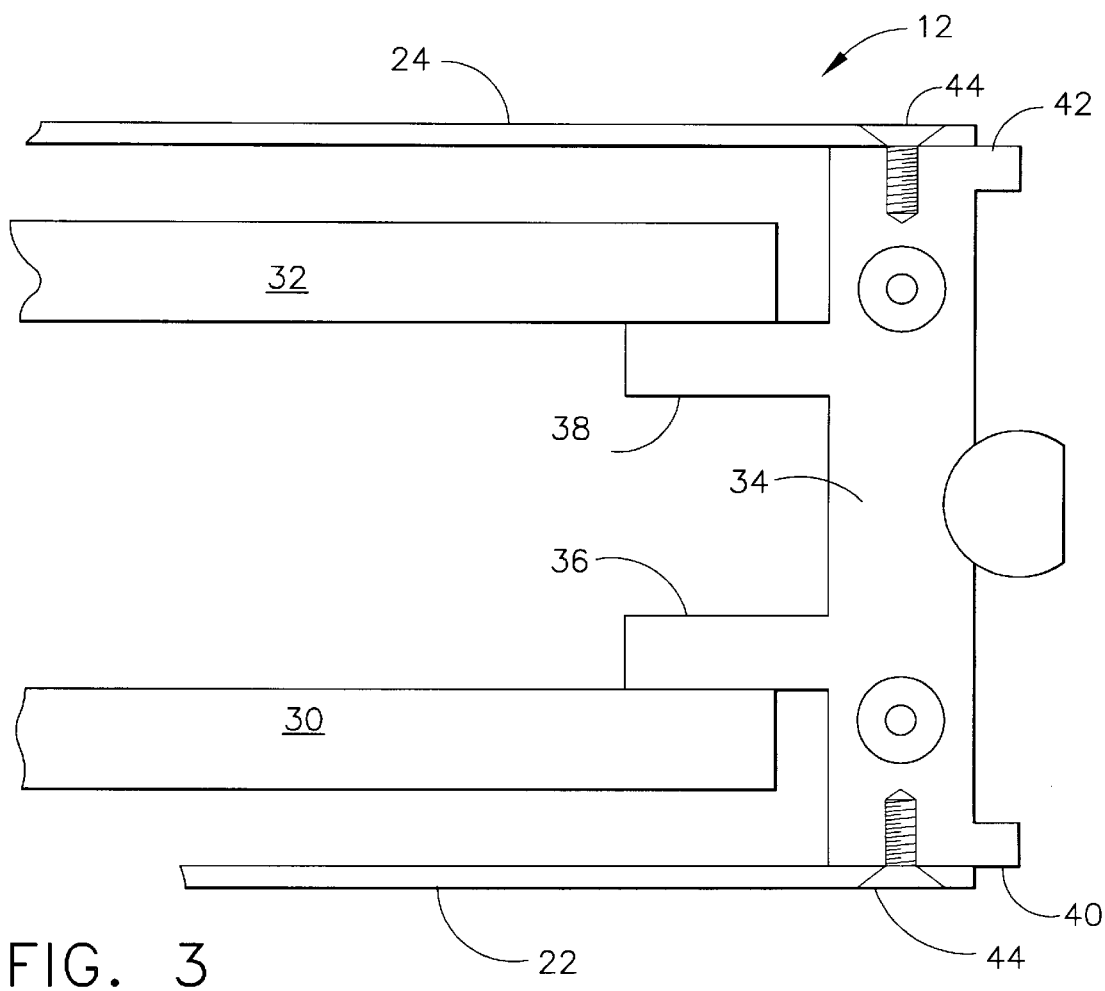
FIG. 3 is a cross-sectional view of an embodiment of the front member of the EMI shielded enclosure of the present invention.
Figure 4:
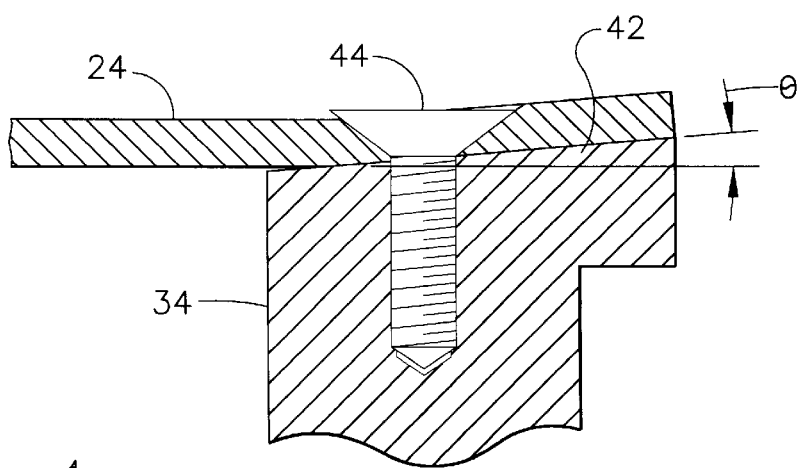
FIG. 4 is an enlarged cross-sectional view of the EMI seam between an embodiment of the front member and the cover of the EMI shielded enclosure of the present invention.

Referring now to FIG. 3, in a further embodiment of the present invention, top member may be configured to retain two circuit board assemblies 30 and 32, although it will be appreciated that top member 12 may be configured to retain one or more circuit board assemblies as space permits. Top member 12 has a base 34 from which extends two circuit board supporters 36 and 38. Circuit board assemblies 30 and 32 may be fixedly attached to circuit board supporters 36 and 38, respectively, by any conventional joining technique, such as by using screws. Covers 22 and 24 are joined to outside surfaces 40 and 42 of base 34 also by any conventional joining technique, such as by screws 44. While not shown in FIG. 3, bottom member 14 can be configured similarly to top member 12 to retain circuit board assemblies 30 and 32 at ends opposite those attached to circuit board supporters 36 and 38 of top member 12. In a further embodiment of the present invention, outside surfaces 40 and 42 may be slightly tapered at an angle θ (theta) measured from an axis normal to the longitudinal axis of base 34. FIG. 4 shows a magnified view of the corner of base 34 as attached to cover 24. (As cover of base 34 is similarly attached to cover 22, FIG. 4 shows only base 34 as attached to cover 24). Top member 12 may be manufactured by an extrusion process that provides for the tapering of sides 40 and 42. Alternatively, top member 12 may be machined to provide for such tapering. When covers 22 and 24 are fastened to outside surfaces 40 and 42 respectively, a load is imparted to covers 22 and 24. Screws 44 slightly deform covers 22 and 24 causing a high load at the extreme perimeters of covers 22 and 24. This loading of the edges of covers 22 and 24 against outside surfaces 40 and 42 constitutes a continuous and tight EMI scam. Angle θ may be between 0.5 and 5 degrees, such as approximately 2.5 degrees, although it will be appreciated that any angle that does not permanently deform covers 22 and 24 but that imports a sufficient load to covers 22 and 24 to form a tight and continuous EMI scam may be used.

In addition to sides 40 and 42 of top member 12, bottom member 14, front member 16 and back member 18 can be similarly tapered so that when covers 22 and 24 are attached to bottom member 14, front member 16 and back member 18, a similar loading is effected to constitute an appropriate continuous EMI seam about the perimeters of covers 22 and 24 thereby effectively reducing interferences from external electromagnetic radiation.

Thus, an EMI shielded enclosure according to various aspects of the present invention tends to provide maximum EMI shielding while minimizing hardware requirements. The EMI shielded enclosure of the present invention reduces the need for a gasket, springs or numerous ffasteners and provides for a tight, durable and continuous EMI seam. Further, because angle θ may be relatively small and does not cause permanent deformation of the covers, the covers may retain sufficient spring pressure needed to maintain tight, effective EMI scams. The EMI shielded enclosure may be used in military aircraft applications or any other applications, such as, for example, medical applications, which benefit from effective EMI shielding. The EMI shielded enclosure includes numerous other features and advantages that are not specifically identified herein. While the present invention has been described with reference to specific preferred embodiments thereof, it will be understood by those skilled in the art that various changes may be made without departing from the true spirit and scope of the invention. In addition, modifications may be made to adapt the invention to a given situation without departing from its essential teaching. Further, no single element or component described in the specification is required for protecting the invention, except as specifically stated herein.

I claim:

1. EMI shielded enclosure for shielding an electrical component comprising:
   a first cover;
   a second cover;
   a top member having a first end, a second end, a first side face and a second side face;
   a bottom member having a first end, a second end, a first side face and a second side face;
   a front member connected to said first ends of said top member and said bottom member and having a first side face and a second side face; and
   a back member connected to said second ends of said top member and said bottom member and having a first side face and a second side face;
   wherein said first cover is attached to said first side faces of said front, back, bottom and top members and wherein at least one of said front, back, bottom and top members has a tapered first side face that is tapered toward an interior of the EMI shielded enclosure; and
   wherein second cover is attached to said second side faces of said front, back, bottom and top members.

2. The EMI shielded enclosure of claim 1 wherein at least one of said front, back, bottom and top members has a tapered second side face that is tapered toward an interior of the EMI shielded enclosure.

3. The EMI shielded enclosure of claim 1 wherein said first cover is attached to said tapered first side face so that a load is imparted to said first cover.

4. The EMI shielded enclosure of claim 2 wherein said second cover is attached to said tapered second side face so that a load is imparted to said second cover.

5. The EMI shielded enclosure of claim 1 wherein said tapered first side face is tapered at an angle that is at least 0.5 degrees and no more than 5 degrees from an axis normal to a longitudinal axis of said at least one of said front, back, bottom and top members.

6. The EMI shielded enclosure of claim 2 wherein said tapered second side face is tapered at an angle that is at least 0.5 degrees and no more than 5 degrees from an axis normal to a longitudinal axis of said at least one of said front, back, bottom and top numbers.

7. The EMI shielded enclosure of claim 1 wherein at least one of said front, back bottom or top members is configured to receive electrical connectors.

8. The EMI shielded enclosure of claim 1 wherein said first cover and said second cover comprise sheet metal of a sufficient thickness to permit flexing under pressure.

9. The EMI shielded enclosure of claim 1 wherein at least one of said front, back, bottom or top members is configured to retain at least one electrical component.

10. The EMI shielded enclosure of claim 9 wherein at least one of said front, back, bottom or top members is configured to permit said EMI shielded enclosure to be stored in a cabinet for holding a plurality of said EMI shielded enclosures.

11. The EMI shielded enclosure of claim 1 wherein said front, back, bottom and top members are comprised of aluminum.

12. An apparatus for shielding at least one electrical component against EMI emissions, wherein said apparatus comprises:
    a frame member having a first side face and a second side face wherein said first side face is tapered toward an interior of the apparatus;
    a first cover, and
    a second cover,
    wherein said first cover is attached to said first side face of said frame member and said second cover is attached to said second side face of said frame member.

13. The apparatus of claim 12 wherein said second side face of said frame member is tapered toward an interior of the apparatus.

14. The apparatus of claim 12 wherein said first cover is attached to said first side face of said frame member so that a load is imparted to said first cover.

15. The apparatus of claim 13 wherein said second cover is attached to said second side face of said frame member so that a load is imparted to said second cover.

16. The apparatus of claim 12 wherein said first side face is tapered at an angle that is at least 0.5 degrees and no more than 5 degrees from an axis that is normal to a longitudinal axis of said frame member.

17. The apparatus of claim 13 wherein said second side face is tapered at an angle that is at least 0.5 degrees and no more than 5 degrees from an axis that is normal to a longitudinal axis of said frame member.

18. The apparatus of claim 12 wherein said frame member is configured to receive electrical connectors.

19. The apparatus of claim 12 wherein said first cover and said second cover comprises sheet metal of a sufficient thickness to permit flexing under pressure.

20. The apparatus of claim 12 wherein said frame member is configured to permit said apparatus to be stored in a cabinet for holding a plurality of said apparatus.

21. The apparatus of claim 12 wherein said frame member is comprised of aluminum.

* * * * *